US009042716B2

(12) United States Patent
Cadugan et al.

(10) Patent No.: US 9,042,716 B2
(45) Date of Patent: May 26, 2015

(54) METHOD AND APPARATUS FOR DETERMINING LINEAR POSITION USING MULTIPLE MAGNETIC FIELD SENSORS

(71) Applicant: Allegro Microsystems, LLC, Worcester, MA (US)

(72) Inventors: Bryan Cadugan, Bedford, NH (US); Alexander Latham, Still River, MA (US)

(73) Assignee: Allegro Microsystems, LLC, Worcester, MA (US)

( * ) Notice: Subject to any disclaimer, the term of this patent is extended or adjusted under 35 U.S.C. 154(b) by 50 days.

(21) Appl. No.: 13/967,681

(22) Filed: Aug. 15, 2013

(65) Prior Publication Data
US 2015/0050013 A1    Feb. 19, 2015

(51) Int. Cl.
| G03B 3/10 | (2006.01) |
| G01B 7/00 | (2006.01) |
| G01B 7/14 | (2006.01) |
| G03B 13/36 | (2006.01) |
| G01D 5/14 | (2006.01) |
| G02B 7/08 | (2006.01) |
| G01R 33/00 | (2006.01) |
| G01R 33/06 | (2006.01) |

(52) U.S. Cl.
CPC ........ *G01B 7/003* (2013.01); *G01B 7/14* (2013.01); *G03B 13/36* (2013.01); *G01D 5/145* (2013.01); *G01R 33/0023* (2013.01); *G01R 33/06* (2013.01); *G02B 7/08* (2013.01)

(58) Field of Classification Search
USPC .................................. 324/207.24, 207.26
See application file for complete search history.

(56) References Cited

U.S. PATENT DOCUMENTS

| 2003/0016465 A1* | 1/2003 | Bui et al. ............... 360/72.3 |
| 2005/0219962 A1 | 10/2005 | Ollila |
| 2005/0258822 A1* | 11/2005 | Hara et al. ............. 324/207.2 |
| 2005/0258825 A1* | 11/2005 | Masuda et al. ......... 324/207.26 |
| 2009/0033319 A1* | 2/2009 | Arns et al. ............. 324/207.24 |
| 2009/0085558 A1* | 4/2009 | David et al. ............ 324/207.2 |
| 2013/0187573 A1* | 7/2013 | Inoue .................... 318/135 |

FOREIGN PATENT DOCUMENTS

| EP | 1 998 146 | 3/2008 |
| JP | 2010096540 | 4/2010 |

(Continued)

OTHER PUBLICATIONS

Allegro MicroSystems, LLC; Application Information; Hall-Effect IC Applications Guide; 27701-AN; Rev. 2; Jan. 1, 2013; 40 pages.
Allegro MicroSystems, LLC; "Low Noise, Linear Hall Effect Sensors ICs with Analog Output;" A1324, A1325 and A1326; A1324-DS, Rev. 2; Jul. 14, 2012; 12 pages.
Gupta, et al.; "Analysis of a Hall-Effect System with Two Linear Sensor ICs for 30 mm Displacement;" Allegro MicroSystems, LLC; Application Information; 296097-AN; Feb. 6, 2013; 8 pages.

(Continued)

*Primary Examiner* — Clayton E Laballe
*Assistant Examiner* — Dennis Hancock
(74) *Attorney, Agent, or Firm* — Daly, Crowley, Mofford & Durkee, LLP

(57) ABSTRACT

The linear position of an object is estimated using multiple magnetic field sensors and a magnet. The multiple magnetic field sensors are held in fixed relation to one another and in moving relation with respect to the magnet. Readings of the first and second magnetic field sensors and the fixed distance between the first and second magnetic field sensors may be used to estimate the linear position. In some embodiments, an estimated frequency of an approximately sinusoidal field versus position characteristic is also used as part of the estimation.

35 Claims, 9 Drawing Sheets

(56) References Cited

FOREIGN PATENT DOCUMENTS

| | | |
|---|---|---|
| WO | WO 2008/101702 | 8/2008 |
| WO | WO 2009/060716 | 5/2009 |

OTHER PUBLICATIONS

Search Report and Written Opinion for PCT Application PCT/US2014/047538, 12 pages.

* cited by examiner

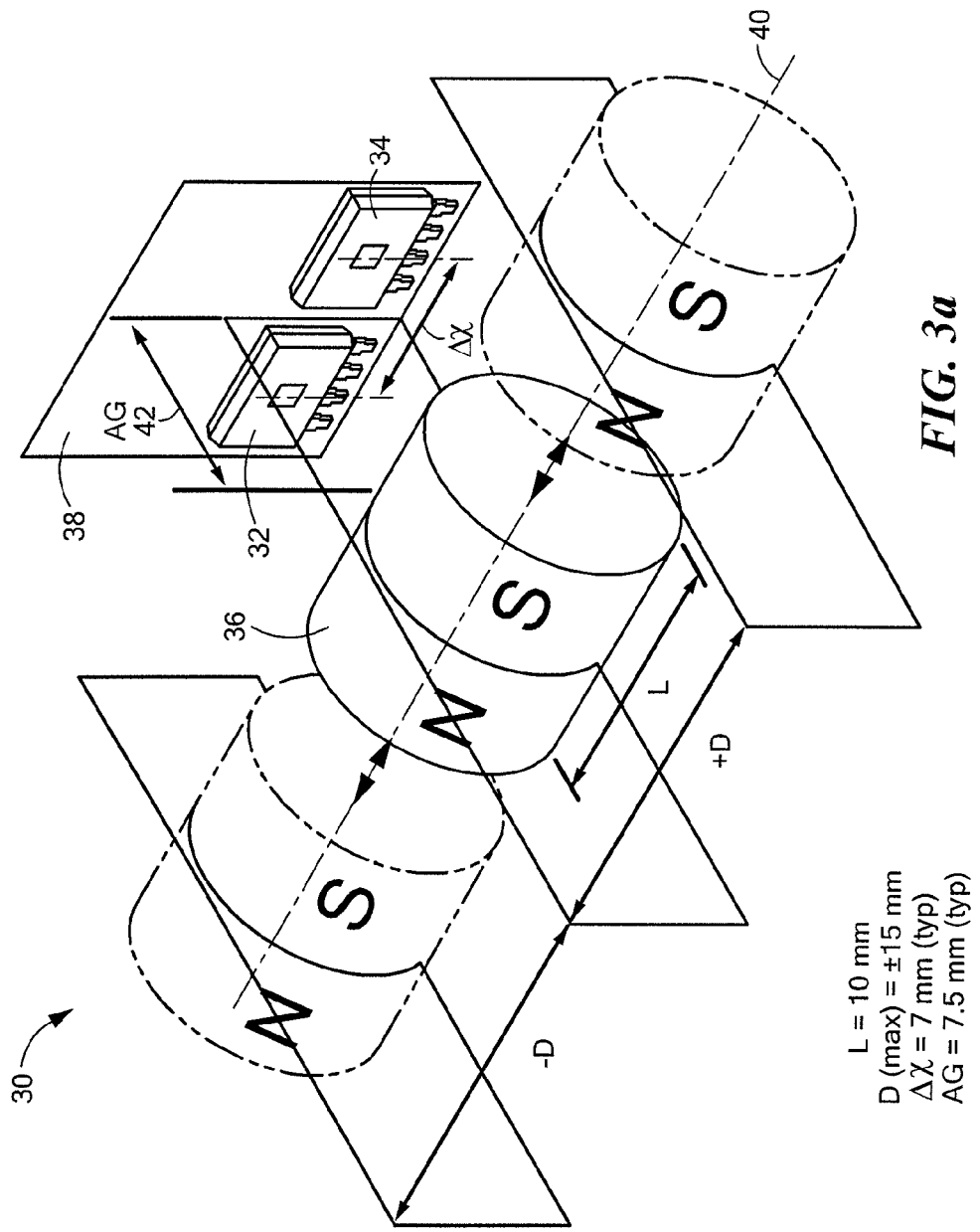

METHOD AND APPARATUS FOR DETERMINING LINEAR POSITION USING MULTIPLE MAGNETIC FIELD SENSORS

FIELD

Subject matter disclosed herein relates generally to sensors and, more particularly, to techniques and devices for estimating position using sensors.

BACKGROUND

Many applications exist that require the linear position of an object to be estimated. In some applications, very precise estimates are needed. One way to estimate object position involves the use of a magnet and a magnetic field sensor. The magnet may be attached to the movable object and the sensor may be held in a fixed position proximate to the magnet. The position of the object relative to the fixed sensor may then be estimated based on the magnetic field readings of the sensor. A problem that arises with this approach is that various factors can compromise position estimate accuracy. For example, manufacturing tolerances (e.g., variability in the air gap between the sensor and the magnet, etc.) can result in errors in the position estimates generated in a system. Similarly, component tolerances (e.g., variability in magnet strength, etc.) can result in position estimate errors. Environmental factors, such as temperature variability and stress effects, may also negatively affect position estimation accuracy in such systems. Position estimation techniques are needed that are more tolerant to some or all of the above described sources of error.

SUMMARY

In accordance with one aspect of the concepts, systems, circuits, and techniques described herein, a machine-implemented method for estimating a relative linear position of an object using a magnet and multiple magnetic field sensors is provided. The multiple magnetic field sensors are held in fixed relation to one another and in moveable relation to the magnet. In addition, either the magnet or the multiple magnetic field sensors may be fixed to the object. More specifically, the method comprises: (a) obtaining an estimate of a frequency of an approximately sinusoidal field reading versus position characteristic associated with the multiple magnetic field sensors and the magnet; (b) acquiring readings of a first magnetic field sensor and a second magnetic field sensor of the multiple magnetic field sensors; and (c) calculating an estimated position of the magnet relative to the first and second magnetic field sensors using the readings of the first and second magnetic field sensors, the estimated frequency, and a fixed distance between the first and second magnetic field sensors.

In one embodiment, the multiple magnetic field sensors further include a third magnetic field sensor that is located between the first and second magnetic field sensors; and obtaining an estimate of a frequency comprises: (i) collecting readings of the first magnetic field sensor, the second magnetic field sensor, and the third magnetic field sensor, and (ii) calculating the estimated frequency using the collected readings of the first, second, and third magnetic field sensors and the fixed distance between the first and second magnetic field sensors.

In one embodiment, the third magnetic field sensor is centered between the first and second magnetic field sensors; and calculating the estimated frequency includes evaluating the equation:

$$\hat{\omega} = \sqrt{\frac{2A3 - A2 - A1}{A3}} \left(\frac{2}{\Delta x}\right),$$

where $\hat{\omega}$ is the estimated frequency in radians per distance, A1 is the reading of the first magnetic field sensor, A2 is the reading of the second magnetic field sensor, A3 is the reading of the third magnetic field sensor, and $\Delta x$ is the fixed distance between the first and second magnetic field sensors.

In one embodiment, obtaining an estimate of a frequency is performed before acquiring readings.

In one embodiment, obtaining an estimate of a frequency comprises retrieving the estimate of the frequency from a memory.

In one embodiment, obtaining an estimate of a frequency comprises estimating the frequency using characterization data associated with the magnet.

In one embodiment, calculating an estimated position of the magnet relative to the first and second magnetic field sensors includes evaluating the equation:

$$\hat{x}_{mid} = \frac{1}{\hat{\omega}} \tan^{-1}\left(\frac{(A2 + A1)\hat{\omega}\Delta x}{2(A2 - A1)}\right)$$

where $\hat{x}_{mid}$ is representative of an estimated linear position of the magnet relative to a midpoint between the first and second magnetic field sensors, A1 is the reading of the first magnetic field sensor, A2 is the reading of the second magnetic field sensor, $\hat{\omega}$ is the estimated frequency, and $\Delta x$ is the fixed distance between the first and second magnetic field sensors.

In one embodiment, the method further comprises repeating acquiring readings and calculating an estimated position to maintain an updated position estimate for the object.

In one embodiment, the method further comprises occasionally updating the estimate of the frequency.

In one embodiment, the multiple magnetic field sensors include at least one of: a Hall effect sensor, a magnetoresistive (MR) sensor, and a magnetotransistor.

In accordance with another aspect of the concepts, systems, circuits, and techniques described herein, an apparatus comprises: multiple magnetic field sensors for use in estimating the linear position of a magnet that moves in relation to the multiple magnetic field sensors, wherein the multiple magnetic field sensors include at least a first magnetic field sensor and a second magnetic field sensor held in fixed relation to one another and separated by a distance $\Delta x$; and a controller to estimate the linear position of the magnet relative to the multiple magnetic field sensors using an estimated frequency of an approximately sinusoidal magnetic field reading versus displacement characteristic associated with the magnet and the multiple magnetic field sensors, a distance between the first and second magnetic field sensors, and readings of the first and second magnetic field sensors.

In one embodiment, the apparatus further comprises a memory to store a value indicative of the estimated frequency, wherein the controller is coupled to the memory.

In one embodiment, the controller is configured to occasionally update the value indicative of the estimated frequency stored within the memory.

In one embodiment, the controller is configured to update the value indicative of the estimated frequency stored within the memory by receiving a new value from an external source and storing the new value or a derivative thereof in the memory.

In one embodiment, the controller is configured to update the value indicative of the estimated frequency stored within the memory by estimating a new value and storing the new value in the memory.

In one embodiment, the multiple magnetic field sensors include a third magnetic field sensor that is located between the first and second magnetic field sensors; and the controller is configured to estimate the frequency of the approximately sinusoidal magnetic field reading versus displacement characteristic using readings of the first, second, and third magnetic field sensors and the fixed distance between the first and second magnetic field sensors.

In one embodiment, the third magnetic field sensor is centered between the first and second magnetic field sensors, and the controller is configured to estimate the frequency based on the following equation:

$$\hat{\omega} = \sqrt{\frac{2A3 - A2 - A1}{A3}\left(\frac{2}{\Delta x}\right)},$$

where $\hat{\omega}$ is the estimated frequency in radians per distance, A1 is a reading of the first magnetic field sensor, A2 is a reading of the second magnetic field sensor, A3 is a reading of the third magnetic field sensor, and $\Delta x$ is the distance between the first and second magnetic field sensors.

In one embodiment, the controller is configured to estimate the position of the magnet relative to the multiple magnetic field sensors based on the equation:

$$\hat{x}_{mid} = \frac{1}{\hat{\omega}}\tan^{-1}\left(\frac{(A2 + A1)\hat{\omega}\Delta x}{2(A2 - A1)}\right)$$

where $\hat{x}_{mid}$ is representative of an estimated position of the magnet relative to a midpoint between the first and second magnetic field sensors, A1 is a reading of the first magnetic field sensor, A2 is a reading of the second magnetic field sensor, $\hat{\omega}$ is the estimated frequency, and $\Delta x$ is the distance between the first and second magnetic field sensors.

In one embodiment, the apparatus is implemented as a single integrated circuit that can be mounted in proximity to an external magnet.

In one embodiment, the apparatus is implemented using multiple chips within a multi-chip module (MCM) that can be mounted in proximity to an external magnet.

In one embodiment, the multiple magnetic field sensors are closely matched in sensitivity.

In one embodiment, the multiple magnetic field sensors include at least one of: a Hall effect sensor, a magnetoresistive (MR) sensor, and a magnetotransistor.

In one embodiment, the multiple magnetic field sensors are for use in estimating the position of a magnet that is affixed to a lens assembly of a camera; and the controller includes an input to receive a position request signal requesting movement of the lens assembly as part of an autofocus operation, wherein the controller is configured to generate a control signal for use in moving the lens assembly in accordance with the position request signal based on the estimated position of the magnet.

In one embodiment, the apparatus further comprises a driver to drive a motor that is coupled to the lens assembly in response to the control signal, wherein the multiple magnetic field sensors, the controller, and the driver are all implemented within a common integrated circuit (IC) or multi-chip module (MCM).

In accordance with still another aspect of the concepts, systems, circuits, and techniques described herein, a camera comprises: a lens assembly having a magnet affixed thereto; at least two magnetic field sensors held in fixed relation to one another and proximate to the magnet, the at least two magnetic field sensors including a first magnetic field sensor and a second magnetic field sensor, wherein the magnet is moveable with respect to the at least two magnetic field sensors; a motor to move the lens assembly in a controlled manner, a driver to drive the motor in response to a control signal; and a controller to estimate a position of the lens assembly for use in focusing the camera, the controller to estimate the position of the lens assembly using an estimated frequency of an approximately sinusoidal magnetic field reading versus displacement characteristic associated with the magnet and the at least two magnetic field sensors, a distance between the first and second magnetic field sensors, and readings of the first and second magnetic field sensors.

In one embodiment, the controller includes an input to receive a position request signal requesting movement of the lens assembly as part of an autofocus operation, wherein the controller is configured to generate the control signal for the driver for use in moving the lens assembly in accordance with the position request signal based on the estimated position of the lens assembly.

In one embodiment, the controller is configured to estimate the position of the lens assembly based on the equation:

$$\hat{x}_{mid} = \frac{1}{\hat{\omega}}\tan^{-1}\left(\frac{(A2 + A1)\hat{\omega}\Delta x}{2(A2 - A1)}\right)$$

where $\hat{x}_{mid}$ is representative of an estimated position of the magnet relative to a midpoint between the first and second magnetic field sensors, A1 is a reading of the first magnetic field sensor, A2 is a reading of the second magnetic field sensor, $\hat{\omega}$ is the estimated frequency, and $\Delta x$ is the distance between the first and second magnetic field sensors.

In one embodiment, the at least two magnetic field sensors includes a third magnetic field sensor that is located between the first and second magnetic field sensors; and the controller is configured to estimate the frequency using readings of the first, second, and third magnetic field sensors and the fixed distance between the first and second magnetic field sensors.

In one embodiment, the third magnetic field sensor is centered between the first and second magnetic field sensors, and the controller is configured to estimate the frequency based on the following equation:

$$\hat{\omega} = \sqrt{\frac{2A3 - A2 - A1}{A3}\left(\frac{2}{\Delta x}\right)},$$

where $\hat{\omega}$ is the estimated frequency, A1 is a reading of the first magnetic field sensor, A2 is a reading of the second magnetic field sensor, A3 is a reading of the third magnetic field sensor, and $\Delta x$ is the distance between the first and second magnetic field sensors.

In accordance with a further aspect of the concepts, systems, circuits, and techniques described herein, a camera comprises: a lens assembly having a magnet affixed thereto; at least two magnetic field sensors held in fixed relation to one another and proximate to the magnet, the at least two magnetic field sensors including a first magnetic field sensor and a second magnetic field sensor, wherein the magnet is moveable with respect to the at least two magnetic field sensors; a motor to move the lens assembly in a controlled manner, a driver to drive the motor in response to a control signal; and a controller to estimate a position of the lens assembly for use in focusing the camera, the controller to estimate the position of the lens assembly based, at least in part, on readings of the first and second magnetic field sensors and a distance between the first and second magnetic field sensors, the controller being configured to estimate the position based on the following equation:

$$\hat{x}_{mid} = \frac{B(A2 + A1)\Delta x}{(2 \times (A2 - A1))}$$

where B is a gain factor, A1 is a reading of the first magnetic field sensor, A2 is a reading of the second magnetic field sensor, and Δx is the distance between the first and second magnetic field sensors.

In one embodiment, the controller includes an input to receive a position request signal requesting movement of the lens assembly as part of an autofocus operation, wherein the controller is configured to generate the control signal for the driver for use in moving the lens assembly in accordance with the position request signal based on the estimated position of the lens assembly.

In one embodiment, the controller and the at least two magnetic field sensors are implemented on a common integrated circuit (IC) or multi-chip module (MCM).

BRIEF DESCRIPTION OF THE DRAWINGS

The foregoing features may be more fully understood from the following description of the drawings in which:

FIGS. 3a and 3b are different views of an exemplary position measurement system having multiple magnetic field sensors in accordance with an embodiment;

DETAILED DESCRIPTION

Figure 1:
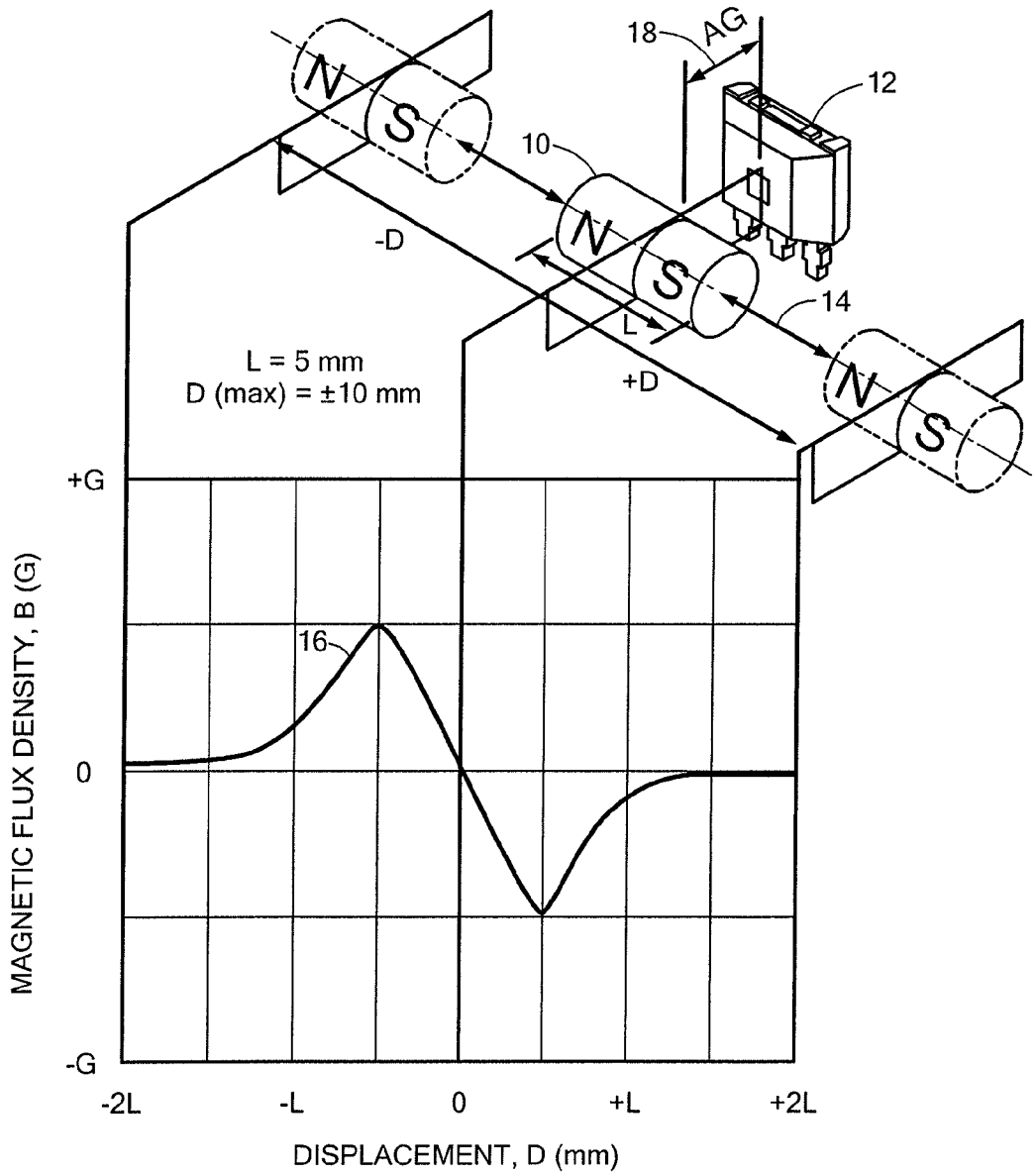
FIG. 1 is a diagram illustrating a conventional position estimation technique using a magnet and a magnetic field sensor in a slide-by configuration.

FIG. 1 is a diagram illustrating a conventional position estimation technique using a magnet 10 and a magnetic field sensor 12. The magnet 10 may be affixed to an object (not shown) for which a position estimate is desired. During normal operation, the object (and thus the magnet 10) may move back and forth along a linear path 14. The sensor 12 may remain in a fixed position with respect to the magnet 10. The magnetic field readings of the sensor 12 may be used to estimate the current linear position of the magnet 10 along the linear path 14. As shown in the lower portion of FIG. 1, a specific relationship will typically exist between the magnetic field reading of the sensor 12 and the position (or displacement) of the magnet 10. The relationship may be referred to as the magnetic field versus position characteristic 16 of the measurement system. Knowledge of this relationship may be used, along with the magnetic field readings of the sensor 12, to estimate a current position of the magnet 10. The estimation technique illustrated in FIG. 1 is known as a "slide-by" operation.

As shown in FIG. 1, an air gap 18 will exist between the magnet 10 and the sensor 12. The size of this air gap 18 will, to some extent, effect the magnitude and/or shape of the magnetic field versus position characteristic 16 of a system. Due to manufacturing tolerances, the size of this air gap 18 may vary from unit to unit during system manufacture. The strength of the magnet 10 may also affect the magnitude and/or shape of the magnetic field versus position characteristic 16 of a system. As with the size of the air gap 18, the strength of magnet 10 may also vary from unit to unit due to manufacturing tolerances. In addition, a particular sensor design may be used with different magnets, having different field strengths, by different end users. In addition to these problems, as described above, temperature variation and/or stress effects within a system can also affect the magnitude and/or shape of the magnetic field versus position characteristic 16. As will be apparent, differences or changes in the magnetic field versus position curve 16 can lead to errors in the position estimates for the object of interest. To overcome these problems, complicated calibration procedures are sometimes used to calibrate each system to account for some or all the different variations that are possible. The calibrations may be used to generate, for example, a gain factor to use in processing the sensor readings.

Figure 2:
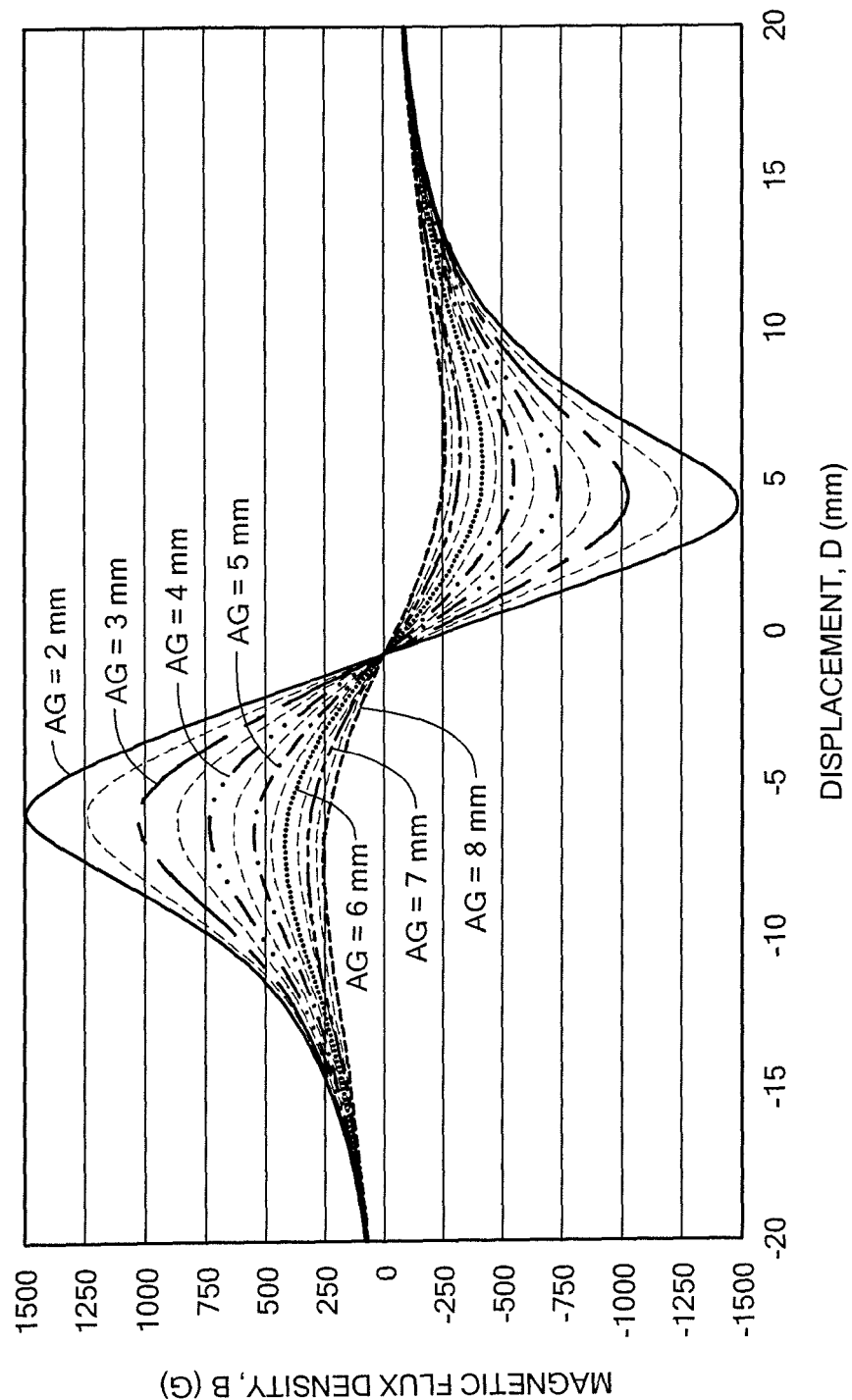
FIG. 2 is a plot illustrating variation of a magnetic field versus position characteristic in a slide-by application based on air gap spacing.

FIG. 2 is a plot illustrating how a magnetic field versus position characteristic may vary for a given sensor/magnet pair based on air gap spacing. In the figure, curves are shown for air gaps from 2 mm through 8 mm. As illustrated, the magnitude of the magnetic field versus position characteristic increases as the air gap gets narrower.

In various embodiments described herein, techniques, devices, and systems are provided that are capable of estimating the linear position of an object in a manner that is less susceptible to variations in one or more parameters of a system. The techniques, devices, and systems may involve the use of multiple magnetic field sensors that are held in fixed relation to one another to estimate object position. As will be described in greater detail, the techniques, devices, and systems may take advantage of the fact that the magnetic field versus position characteristic associated with a slide by operation will typically approximate a sinusoid in shape. The techniques, devices, and systems may be used with any type of magnetic field sensors that produce such a characteristic including, for example, Hall effect sensors, magneto-resistance (MR) based sensors, and magneto-transistor based sensors. In the discussion that follows, the techniques, devices, and systems will be described in the context of Hall effect sensors (e.g., Allegro Microsystems part no. A1363, etc.), but it should be understood that other sensor types may alternatively be used.

FIG. 3a is an isometric view of an exemplary position measurement system 30 having multiple magnetic field sensors in accordance with an embodiment. As illustrated, the system 30 includes first and second magnetic field sensors 32, 34 and a magnet 36. The first and second magnetic field sensors 32, 34 are mounted in fixed relation to one another with a fixed distance Δx therebetween. In some implementations, the first and second magnetic field sensors 32, 34 may be matched devices having substantially the same (or very close) magnetic field sensitivities. In one possible approach, the first and second magnetic field sensors 32, 34 may each be mounted, at least roughly, according to a plane 38. The magnet 36 may be moveable with respect to the sensors 32, 34 along a linear path 40. The linear path 40 may, in some implementations, be parallel or substantially parallel to the plane 38 associated with the sensors 32, 34. An air gap 42 may exist between the plane 38 of the sensors 32, 34 and the magnet 36. As shown, the magnet 36 may have a north pole and a south pole at opposite ends along the linear path 40. In the illustrated embodiment, the magnet 36 is nominally 10 millimeters (mm) in length and the maximum displacement of the magnet 36 along the linear path 40 from a position corresponding to a midpoint between the first and second magnetic field sensors 32, 34 is nominally 15 mm. Also, the air gap 42 in the illustrated embodiment is nominally 7.5 mm and the fixed distance between the first and second sensors 32, 34 is nominally 7 mm. As will be appreciated, these parameters will typically vary in other implementations.

Figure 3B:
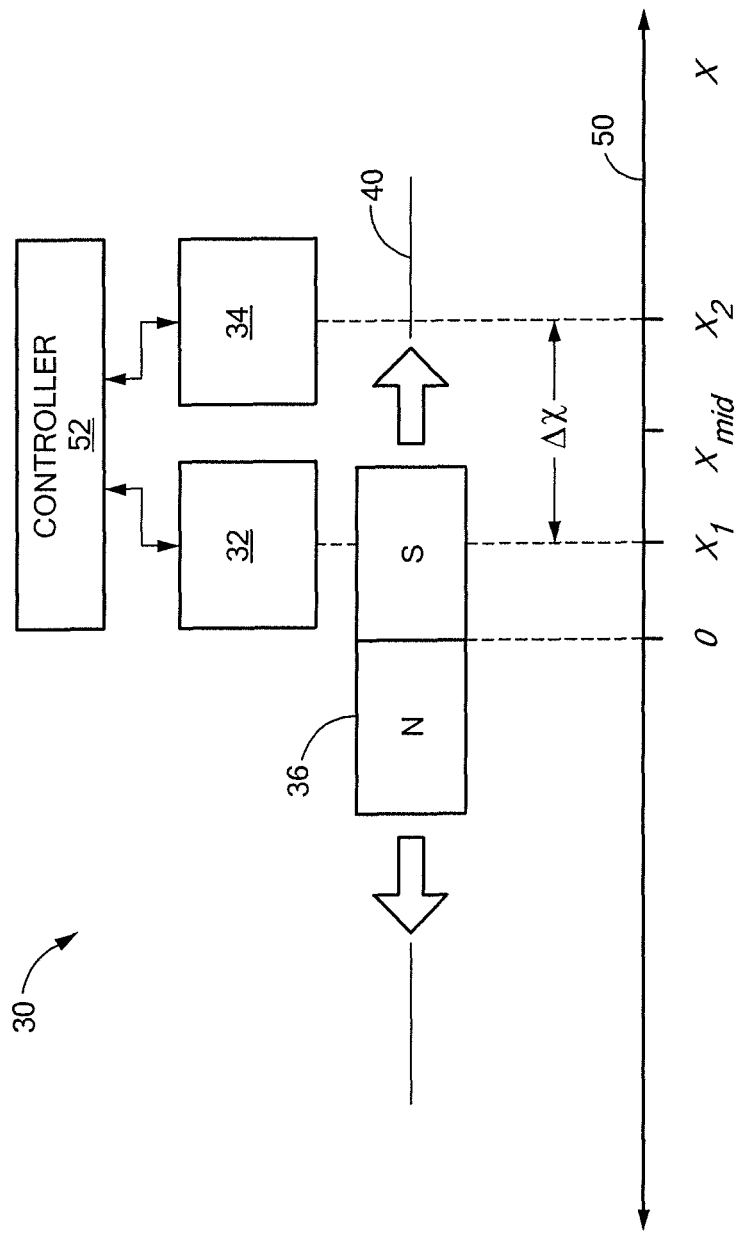

FIG. 3b is a top view of the exemplary system 30 of FIG. 3a that shows a coordinate system 50 that may be used to define linear position in the system. The x-axis of the coordinate system 50 is parallel to the linear path 40 associated with the magnet 36. As illustrated, the center of the magnet 36 may be defined as the x=0 position in the coordinate system 50 and the relative position of the midpoint between the first and second sensors 32, 34 and the magnet 36 (i.e., $x_{mid}$) may be taken as the relative linear position. It should be appreciated that the relative position may be defined differently in other implementations. Also, in different implementations, either the magnet or the sensors may be fixed to the object or structure for which a position estimate is desired. In addition, either the magnet or the sensors may actually move while the other remains stationary in different implementations. As shown in FIG. 3b, a controller 52 may be coupled to the first and second sensors 32, 34 to estimate the relative position based on readings of the sensors.

In one approach to estimating a relative position using two magnetic field sensors, the readings of the two sensors are used to normalize to a set slope. For example, if A1 and A2 are the readings one of the two sensors, then the average of the readings is (A2+A1)/2 and the difference of the readings is (A2−A1). The average may then be normalized using the difference to generate the normalized output:

$$\frac{(A2+A1)}{(2\times(A2-A1))}. \qquad \text{Equation 1}$$

This normalized value can be multiplied by the distance Δx between the sensors (in microns) to generate a factor of 1 per micron. A gain factor may also be applied to this equation to generate a desired microns per position code. This equation is most accurate when well-matched sensors (i.e., sensors having very close sensitivities) are used. No additional calibration is required to use this equation.

The above-described approach can, in some circumstances, produce a relatively consistent position value regardless of variations in sensor sensitivity or magnet strength. However, this approach works best in systems where the magnetic field varies relatively linearly with position. The technique does not work well when non-linearity is involved. When there is non-linearity in the field versus position characteristic, an offset will exist in the output that is not compensated for by the equation. In addition, this offset is dependent on the sensitivity making it inconsistent over temperature.

In accordance with one aspect of the techniques described herein, it was appreciated that the field versus displacement characteristic of certain magnetic field sensors in slide by operations approximate a sinusoid over at least a portion of the operating range thereof. That is, the field may be approximated using the equation:

$$f(x)=A\sin(\omega x)$$

where A is the magnitude of the sinusoid and ω is the frequency. It can be shown that the normalized output equation described above can, under at least some conditions, be approximated as follows:

$$\frac{(A2+A1)\Delta x}{2(A2-A1)} = \frac{(f(x2)+f(x1))/2}{(f(x2)-f(x1))/\Delta x} \cong \frac{f\left(\frac{x2+x1}{2}\right)}{f'\left(\frac{x2+x1}{2}\right)} = \frac{f(x_{mid})}{f'(x_{mid})}$$

The derivative of above described sinusoidal field equation f(x) is:

$$f'(x)=A\omega\cos(\omega x)$$

Thus, $$\frac{f(x)}{f'(x)} = \frac{A\sin(\omega x)}{A\omega\cos(\omega x)} = \frac{\tan(\omega x)}{\omega}$$

It then follows that:

$$\frac{(A2+A1)\Delta x}{2(A2-A1)} \cong \frac{\tan(\omega x_{mid})}{\omega}$$

Solving for $x_{mid}$ then results in:

$$x_{mid} = \frac{1}{\omega}\mathrm{atan}\left(\frac{(A2+A1)(\Delta x)(\omega)}{2(A1-A2)}\right), \quad \text{Equation 2}$$

The above equation for $x_{mid}$ can be used to generate a position estimate in any system that uses multiple magnetic field sensors when a sinusoidal or nearly sinusoidal magnetic field versus displacement characteristic exists in the system. To evaluate the equation, the fixed distance $\Delta x$ between the sensors must be known. Similarly, the frequency, $\omega$ of the sinusoidal magnetic field characteristic must also be known or approximated. A position measurement system may include a memory to store values indicative of frequency $\omega$ and distance $\Delta x$ for use in determining a position estimate using the above described equation or a similar equation. The controller 52 of FIG. 3b may be configured to estimate relative position using Equation 2 above or a similar equation.

The frequency $\omega$ may be approximated in a variety of different ways including, for example, using characterization data associated with a corresponding magnet, by performing trimming for each module by taking a few measurements and doing some approximation, and others. As described above, the approximated or estimated value of frequency $\omega$ may then be stored within a memory of the system for future use. In some implementations, an estimate of frequency $\omega$ may be developed during system manufacture or by an end user and then stored in the memory. Also, in some implementations, techniques for estimating frequency $\omega$ may be built-in to a measurement system (e.g., programmed in controller 52 of FIG. 3b, etc.). In some implementations, updates of the frequency $\omega$ may occasionally be performed within a system to account for changes within the system over time. For example, a system that is capable of estimating $\omega$ internally may be programmed to perform periodic or sporadic updates of the value. A system may, for example, be configured to perform updates whenever a predetermined environmental condition is detected (e.g., a particular temperature change is detected, etc.). Some systems may permit both internal and external updates to the estimated frequency value.

Figure 4:
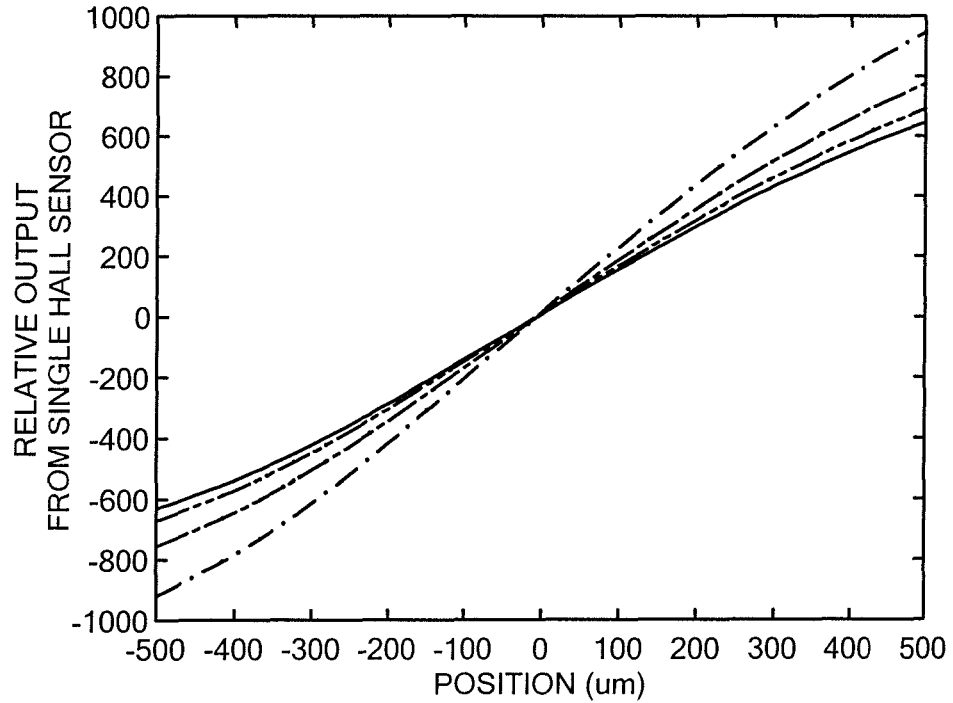
FIG. 4 is a plot illustrating magnetic field versus position curves for a single Hall element magnetic field sensor in a slide by configuration.
Figure 5:
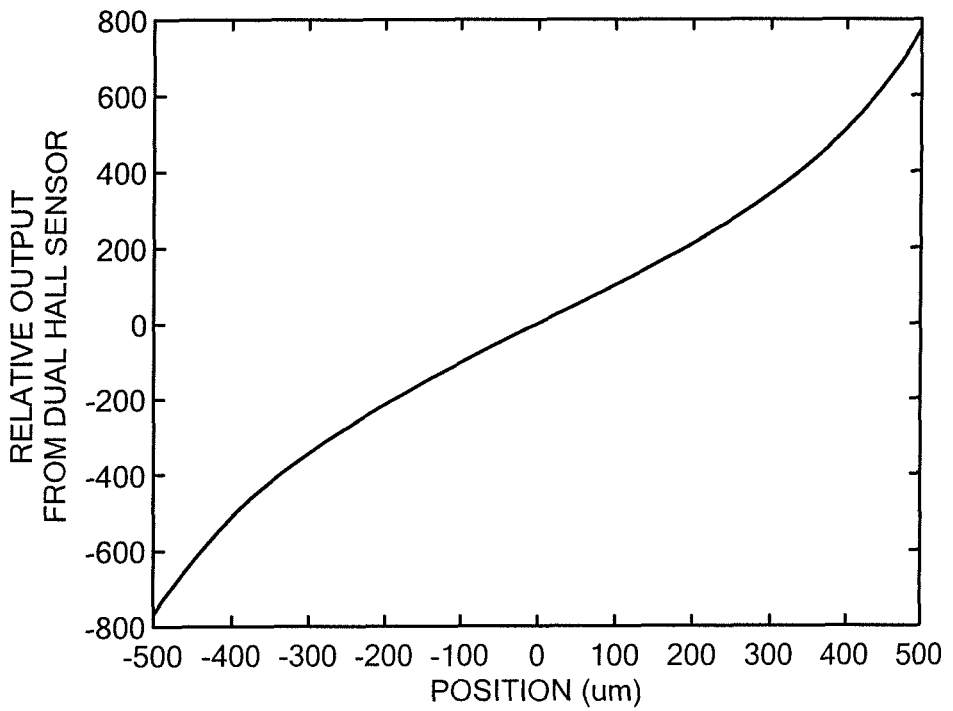
FIG. 5 is a plot illustrating the output of a position measurement system that uses two Hall element magnetic field sensors and a simple dual element equation.
Figure 6:
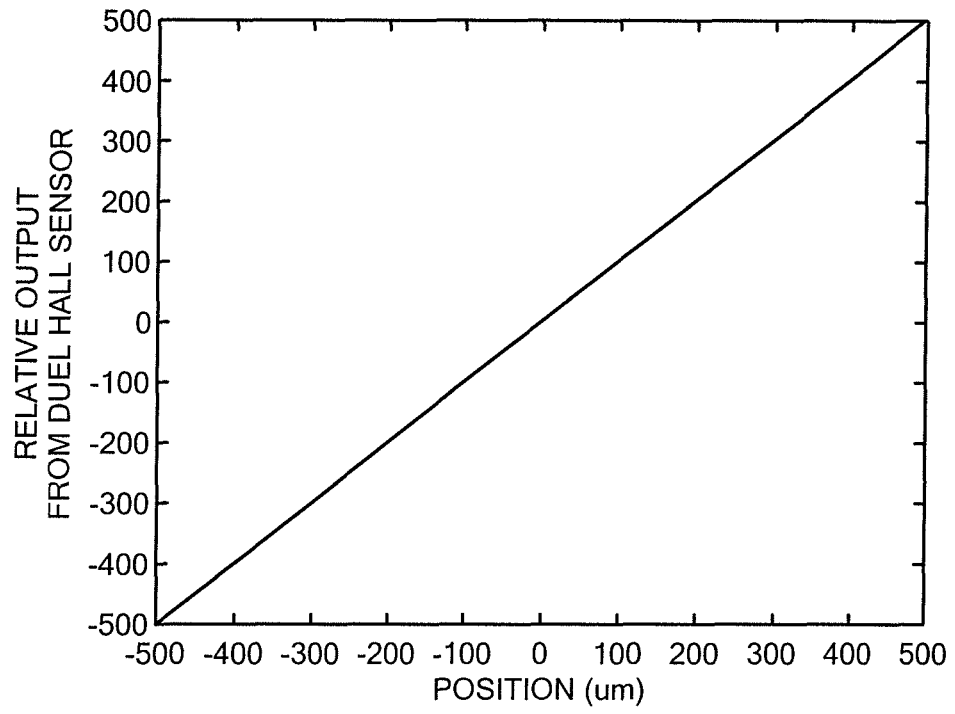
FIG. 6 is a plot illustrating the output of a position measurement system that uses two Hall element magnetic field sensors and an arc tangent dual element equation in accordance with an embodiment.
Figure 7:
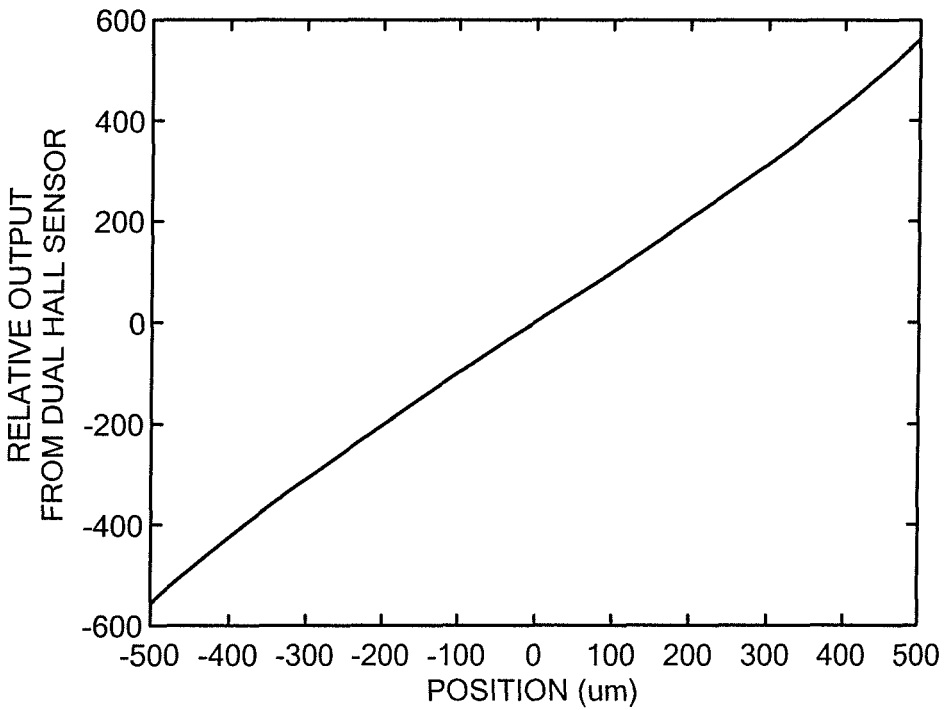
FIG. 7 is a plot illustrating the output of a position measurement system that uses two Hall element magnetic field sensors and the arc tangent dual element equation, where the estimate of the frequency, ω, is off by 20%.

FIG. 4 is a plot illustrating magnetic field versus position curves for a single Hall element magnetic field sensor in a slide by configuration. As shown, the different curves have substantially the same frequency, but different magnitudes. The different magnitudes may result from, for example, different air gaps or some other variable parameter that reduces coupling between the magnet and the sensor. FIG. 5 is a plot illustrating the output of a position measurement system that uses two Hall element magnetic field sensors and the simple dual element equation described previously (i.e., Equation 1). In this case, there is only one curve for all different coupling scenarios, but the curve is not linear with position. In fact, the curve is less linear than the single sensor curves of FIG. 4. FIG. 6 is a plot illustrating the output of a position measurement system that uses two Hall element magnetic field sensors and the arc tangent dual element equation (i.e., Equation 2). As shown, the curve is very linear with position and does not change with variations in coupling. FIG. 7 is a plot illustrating the output of a position measurement system that uses two Hall element magnetic field sensors and the arc tangent dual element equation, where the estimate of the frequency $\omega$ is off by 20%. As shown, the curve of FIG. 7 displays more non-linearity than that of FIG. 6, but still does not change substantially with variations in coupling. To avoid the non-linearity displayed in FIG. 7, a more accurate estimate of frequency can be made.

In the embodiment described above, two magnetic field sensors are used to estimate the relative location of an object. It should be appreciated that similar techniques to those described above may be used with three or more magnetic field sensors. In addition, in some implementations, systems that use three or more sensors may be configured to perform automatic updates of the frequency estimate used to determine position. This feature can be used to, for example, perform periodic updates of the estimated frequency to compensate for changes to the system over time. One or more additional magnetic field sensors can allow the curvature of the characteristic to be measured, thereby permitting the frequency to be estimated.

Figure 8:
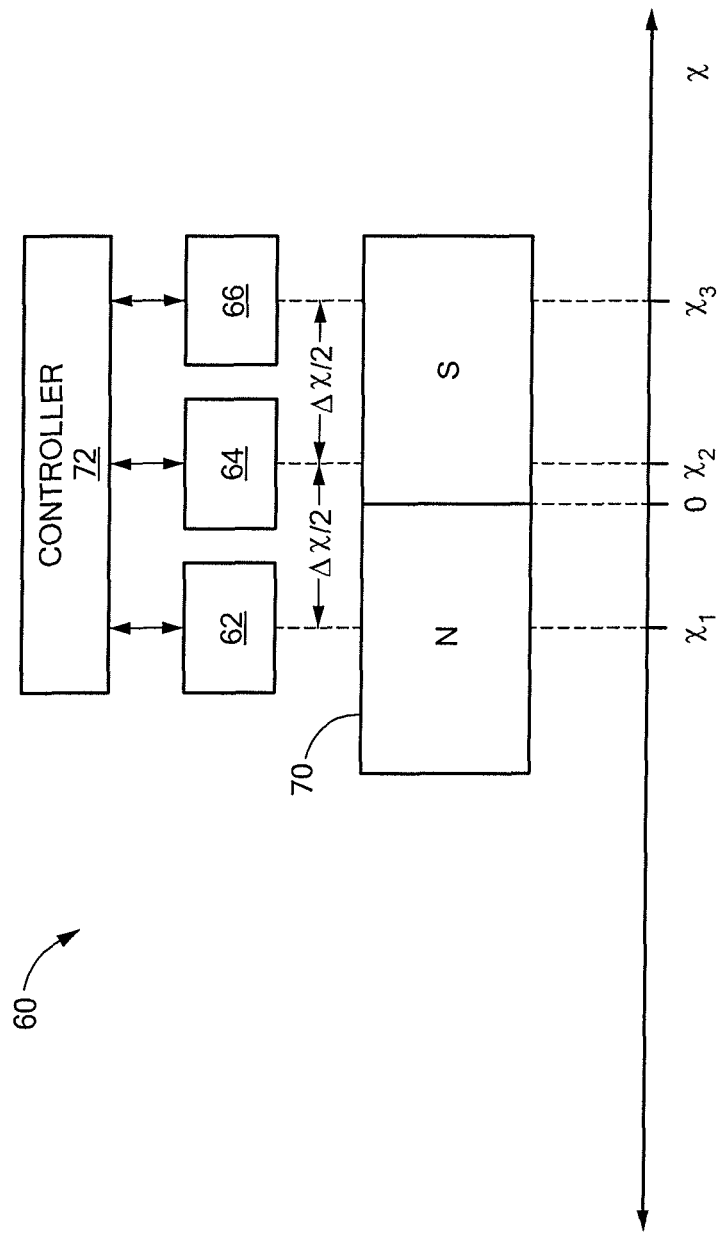
FIG. 8 is a diagram illustrating a position measurement system that is capable of estimating the frequency of a magnetic field versus position characteristic in accordance with an embodiment.

FIG. 8 is a diagram illustrating a position measurement system 60 that is capable of estimating the frequency of a magnetic field versus position characteristic in accordance with an embodiment. As illustrated, the system 60 includes three magnetic field sensors 62, 64, 66 and a magnet 70 in a slide by configuration. In addition, a controller 72 is coupled to the three magnetic field sensors 62, 64, 66 to estimate the relative position of the magnet 70 with respect to the sensors 62, 64, 66 based, at least in part, on sensor readings. The center of the magnet 70 is again taken as the origin (i.e., x=0) of the coordinate system. The three magnetic field sensors 62, 64, 66 are spaced $\Delta x/2$ apart along a line. Thus, the two outermost sensors 62, 66 are $\Delta x$ apart. The locations of the sensors 62, 64, 66 may be denoted x1, x2, and x3, where x2 is the center position to be estimated. The outputs of the sensors 62, 64, 66 may be denoted A1, A2, and A3. The second derivative can be approximated using the values of the three sensor readings as follows:

$$f''(x) \cong \frac{A3 - 2A2 + A1}{\left(\frac{\Delta X}{2}\right)^2}$$

Assuming a sinusoidal field versus position curve as before, the second derivative of f(x) may also be expressed as:

$$f''(x) = -\omega^2 A \sin(\omega x)$$

Dividing the second derivative by the function gives:

$$\frac{f''(x)}{f(x)} = \frac{-\omega^2 A \sin(\omega x)}{A \sin(\omega x)} = -\omega^2$$

Thus:

$$\frac{f''(x_{mid})}{f(x_{mid})} = -\omega^2 \cong \frac{A3 - 2A2 + A1}{A2\left(\frac{\Delta x}{2}\right)^2}$$

Solving for $\omega$ results in:

$$\omega \cong \sqrt{\frac{2A2 - A3 - A1}{A2}}\left(\frac{2}{\Delta x}\right) \quad \text{Equation 3}$$

The controller 72 of FIG. 8 may be configured to evaluate Equation 3 above or a similar equation to estimate a value of frequency ω.

It should be appreciated that Equation 3 above corresponds to a situation where one sensor is centered between two other sensors. If a sensor is between two other sensors, but is not centered, then another more complex equation may be derived to calculate the estimated frequency. Techniques for deriving such an equation will be apparent to persons of ordinary skill in the art based on the present disclosure. In general, the third sensor may be used to estimate the second derivative of the observed signal.

Once the estimate of k is made, it may be used within the position equation described previously (i.e., Equation 2) or a similar equation. Thus, the frequency of the sinusoid does not have to be known or trimmed before use, but may be estimated during use by the end user. As described above, in some implementations, this technique may be used to occasionally (e.g., periodically, sporadically, in response to a condition, etc.) update the estimated frequency stored within a position measurement system during the life of the system. Thus, even if a large change occurs in the actual frequency of the approximately sinusoidal characteristic curve over time, a system may still be capable of operating in a relatively linear fashion. Similar techniques involving four or more sensors may be alternatively be used. As will be appreciated, each additional sensor used may allow the system to know more about the actual shape of the magnetic field curve in relation to actual position.

Figure 9:
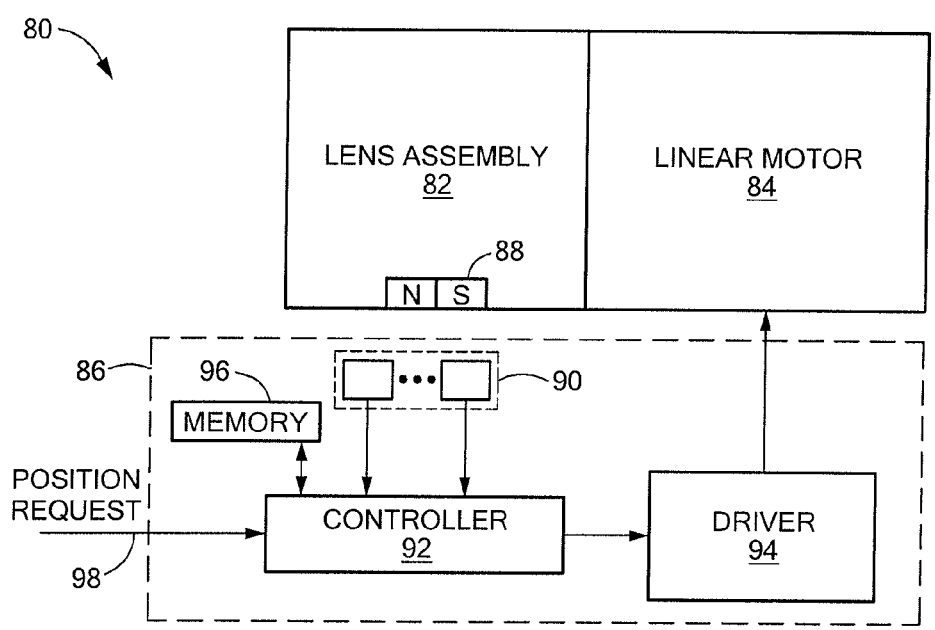
FIG. 9 is a block diagram illustrating portions of a camera using positioning techniques described herein in accordance with an embodiment.

The various techniques and features described herein may be used in any of a wide variety of slide by applications. In one application, for example, the techniques may be used within a auto-focus subsystem within a camera (e.g., a still camera, a video camera, etc.). FIG. 9 is a block diagram illustrating portions of a camera 80 using positioning techniques described herein in accordance with an embodiment. As shown, the camera system 80 may include: a lens assembly 82, a linear motor 84, and a lens positioning unit 86. The lens assembly 82 represents the movable portion of a lens that can be moved back and forth along a linear path to focus the lens. The linear motor 84 may include a voice coil motor (VCM) or other motor unit coupled to the lens assembly 82 to controllably modify the location of the assembly. The lens positioning unit 86 is a subsystem that can sense a current position of the lens assembly 82 and generate a control signal to move the lens assembly 82 in a desired manner based on a position request signal from an auto focus unit (not shown).

As shown in FIG. 9, the lens assembly 82 may have a magnet 88 coupled thereto for use in position estimation. The lens positioning unit 86 may include a plurality of magnetic field sensors 90, a controller 92, a driver 94, and a memory 96. The controller 92 is operative for controlling operation of the lens positioning unit 86. The controller 92 (and the other controllers described herein) may be implemented using, for example, one or more digital processing units and/or one or more discrete components or elements. The digital processing units may include one or more of, for example, a general purpose microprocessor, a digital signal processor (DSP), a reduced instruction set computer (RISC), a field programmable gate array (FPGA), a programmable logic array (PLA), an application specific integrated circuit (ASIC), a microcontroller, an embedded controller, or some other processing device. In some implementations, program information to be executed within the controller 92 may be stored within memory 96 or another memory.

Some or all of the elements of the lens positioning unit 86 may be implemented using a single integrated circuit (IC) or multi-chip module (MCM). For example, in at least one implementation, the controller 92, the plurality of magnetic field sensors 90, and the memory 96 are implemented on a common IC. The driver 94 may also be implemented on the common IC. Separate components may alternatively be used. In at least one implementation, the position estimation functions and the lens assembly movement functions may be implemented separately (e.g., using separate controllers or subsystems, etc.).

The plurality of magnetic field sensors 90 may include two or more magnetic field sensors. These sensors may include, for example, Hall effect sensors, magneto-resistance (MR) based sensors, magneto-transistor based sensors, and/or others. The controller 92 may be configured to estimate the relative position of the lens assembly 82 based on readings of the magnetic field sensors 90. If magnetic field sensors are used that display approximately sinusoidal field versus position characteristics in slide by applications, then controller 92 may use Equation 2 described above, or a similar equation, to generate the estimated position of the lens assembly 82. If magnetic field sensors are used that display relatively linear field versus position characteristics in slide by applications, then controller 92 may use Equation 1 described above, or a similar equation, to generate the estimated position. The memory 96 may store, among other things, an estimated frequency of the field versus position characteristic of the system for use in estimating current position.

The controller 92 may also include an input to receive a position request 98 from an autofocus unit (not shown) indicating a desired position for the lens assembly 82 during an autofocus operation. The controller 92 may use the estimated position of the lens assembly 82 and the position request to determine an input signal for the driver 94 to drive the linear motor 84 in the appropriate manner for carrying out the autofocus operation. Techniques for generating such signals are well known in the art.

In some implementations, the frequency of the field versus position characteristic may be estimated during manufacture and stored within the memory 96 before sale to the end user. In other implementations, the frequency may be automatically estimated by the lens positioning unit 86. Updates of the estimated frequency may also be made at various times during the life of the camera 80 in some embodiments. As described previously, to perform automatic frequency estimations, the plurality of magnetic field sensors 90 may include three of more magnetic field sensors. The controller 92 may be configured to use Equation 3 described above or a similar equation to estimate the frequency. The estimated frequency may then be stored within memory 96 for use during subsequent position estimation operations. If sensors that display relatively linear field versus position characteristics in slide by applications are used, then an estimate of the frequency ω is not required.

Figure 10:
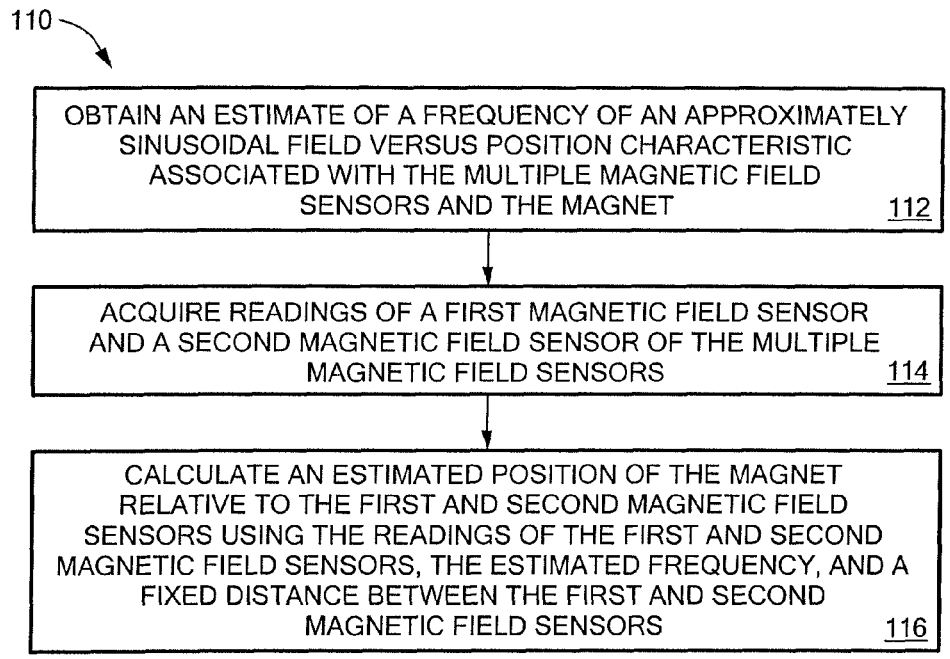
FIG. 10 is a flow diagram illustrating an exemplary method for estimating a relative position of an object in accordance with an embodiment.
Figure 11:
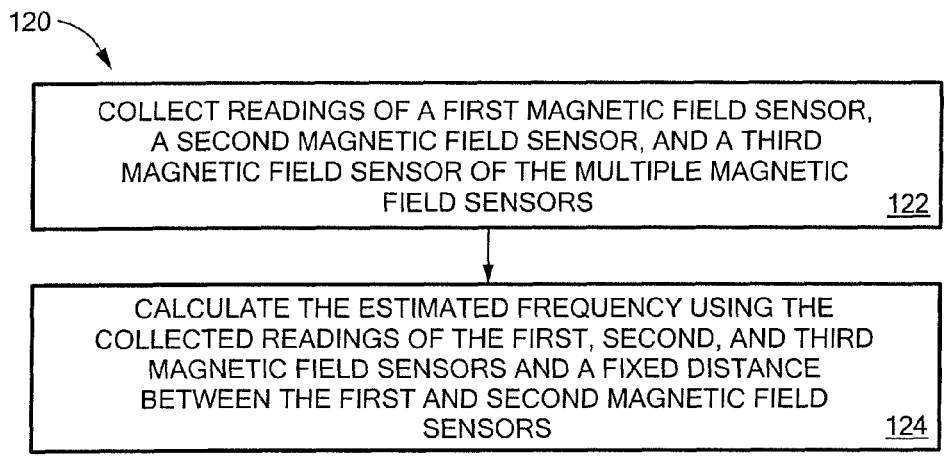
FIG. 11 is a flow diagram illustrating a method for estimating a frequency of a field versus position characteristic associated with a position measurement system in accordance with an embodiment.

FIGS. 10 and 11 are flow diagrams illustrating methods for processing magnetic field sensor readings within a linear position estimation system in accordance with various embodiments.

The rectangular elements (typified by element 112 in FIG. 10) are herein denoted "processing blocks" and may represent computer software instructions or groups of instructions. It should be noted that the flow diagrams of FIGS. 10 and 11 represent exemplary embodiments of designs described herein and variations in such diagrams, which generally follow the process outlined, are considered to be within the scope of the concepts, systems, and techniques described and claimed herein.

Alternatively, the processing blocks may represent operations performed by functionally equivalent circuits such as a digital signal processor circuit, an application specific integrated circuit (ASIC), or a field programmable gate array (FPGA) or other reconfigurable hardware. Some processing blocks may be manually performed while other processing blocks may be performed by a processor or other circuitry. The flow diagram does not depict the syntax of any particular programming language. Rather, the flow diagram illustrates the functional information one of ordinary skill in the art requires to fabricate circuits and/or to generate computer software to perform the processing required of the particular apparatus. It should be noted that many routine program elements, such as initialization of loops and variables and the use of temporary variables may not be shown. It will be appreciated by those of ordinary skill in the art that unless otherwise indicated herein, the particular sequence described is illustrative only and can be varied without departing from the spirit of the concepts described and/or claimed herein. Thus, unless otherwise stated, the processes described below are unordered meaning that, when possible, the sequences shown in FIGS. 10 and 11 can be performed in any convenient or desirable order.

FIG. 10 is a flow diagram illustrating an exemplary method 110 for estimating a relative position of an object in accordance with an embodiment. The method 110 may be used in systems having a magnet and multiple magnetic field sensors arranged in a slide-by configuration (e.g., system 30 of FIGS. 3a and 3b, system 60 of FIG. 8, camera 80 of FIG. 9, etc.). An estimate of a frequency of an approximately sinusoidal field versus position characteristic associated with the magnet and the sensors is first obtained (block 112). Readings of first and second magnetic field sensors may then be acquired (block 114). An estimated position of the magnetic relative to the first and second magnetic field sensors may then be calculated based, at least in part, on the readings of the first and second magnetic field sensors, the estimated frequency, and a fixed distance between the first and second sensors (block 116). The estimated position may be calculated using, for example, Equation 2 described above or a similar equation.

The frequency estimate may be obtained in any of a variety of different ways. In one approach, the frequency estimate is obtained by retrieving it from a memory. A specific memory location associated with a measurement system may be selected to store a value indicative of the estimated frequency. When a position estimation operation is being performed, the stored value may be retrieved and used to estimate position. In another approach, the frequency may be estimated within the measurement system itself using readings of the multiple magnetic field sensors. This approach may be used to update the estimate value stored in the memory or it may be performed in real time during a position estimation operation to generate a frequency estimate for use in position estimation.

FIG. 11 is a flow diagram illustrating a method 120 for estimating a frequency of a field versus position characteristic within a position measurement system in accordance with an embodiment. The estimated frequency may subsequently be used to estimate a relative position of an object within the system. The method 120 may be used in systems having a magnet and three or more magnetic field sensors arranged in a slide-by configuration (e.g., system 60 of FIG. 8, camera 80 of FIG. 9, etc.). First, readings are collected for first, second, and third magnetic field sensors (block 122). The third magnetic field sensor may be located halfway between the first and second sensors. The frequency is then estimated using the collected readings and a fixed distance between the first and second magnetic field sensors (block 124). The estimated frequency may be calculated using, for example, Equation 3 described above or a similar equation.

In some implementations, the exemplary methods 110, 120 of FIGS. 10 and 11 may be implemented within one or more controllers of a measurement system (e.g., controller 52 of FIG. 3b, controller 72 of FIG. 8, controller 92 of FIG. 9, etc.). As described above, these controllers may each include one or more digital processing devices for carrying out desired tasks or functions.

In at least one implementation, the frequency of a field versus position characteristic associated with a position measurement system may be estimated using only two magnetic field sensors. This technique may be used in, for example, system 30 of FIGS. 3a and 3b to determine the estimated frequency. As a magnet is sliding by first and second sensors, values may be read from the sensors at a time $t_1$ to give values $A_1(t_1)$ and $A_2(t_1)$ for the first and second sensors, respectively. As the magnet continues to slide, the reading of the second sensor may be monitored. When the reading of the second sensor gets to the value read from the first sensor at time $t_1$, the current value of the first sensor may be recorded (i.e., $A_1(t_2)$). These three readings may then be used to determine the estimated frequency in the same manner that the readings of the first, second, and third sensors were used in previously described embodiments. That is, the three readings may be used within, for example, Equation 3 described above or a similar equation to determine a frequency estimate. It may be assumed that the distance between the two sensors is $\Delta x/2$. The three readings will be equally spaced apart because at time $t_2$, the second sensor will be located at the position of the first sensor at time $t_1$. This technique requires sensors that are relatively well matched in sensitivity. If the time span between $t_1$ and $t_2$ is low, it may be assumed that no significant changes in air gap or sensitivity occur between the readings. As before, such as estimate may be made once or repeatedly during the lifetime of a measurement system (i.e., to keep the estimated frequency value updated). This technique can be further extended to simulate readings of N sensors (N>3) by waiting additional time steps to develop more detailed information on the field reading versus position characteristic.

As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet, and a magnetic field sensor that senses a magnetic field density of a magnetic field.

As used herein, the phrase "configured to" is intended to cover any device or system that is specially adapted to perform a particular task or function. This may include, for example, an electrical circuit that is designed to perform a task or function. It may also include, for example, a reconfigurable hardware unit (e.g., an FPGA, a PLA, etc.) that is configured with configuration information to perform a task or function. It may further include, for example, a programmed or programmable processor or processors that have associated software to perform a task or function. As such, a reconfigurable or programmable unit is considered "configured to" perform a task or function if it has access to a memory or storage device having information or software that is capable of carrying out the task or function when loaded into the reconfigurable or programmable unit.

In some embodiments, various methods, features, and techniques described herein may be implemented as computer instructions stored on one or more non-transitory computer readable media. These instructions may be loaded from the media into a computer to be executed. In other embodiments, various methods, features, or techniques described herein may be implemented as configuration data stored on one or more non-transitory computer readable media for use in configuring reconfigurable hardware. Any type of computer readable media may be used including, for example, floppy disks, hard disks, optical disks, compact disc read only memories (CD-ROMs), digital video discs (DVDs), BluRay disks, magneto-optical disks, read only memories (ROMs), random access memories (RAMs), erasable programmable ROMs (EPROMs), electrically erasable programmable ROMs (EEPROMs), magnetic or optical cards, flash memory, and/or other types of media suitable for storing electronic instructions or data, including combinations of the above.

Having described exemplary embodiments of the invention, it will now become apparent to one of ordinary skill in the art that other embodiments incorporating these concepts may also be used. The embodiments contained herein should not be limited to disclosed embodiments but rather should be limited only by the spirit and scope of the appended claims. All publications and references cited herein are expressly incorporated herein by reference in their entirety.

What is claimed is:

1. A machine-implemented method for estimating a relative linear position of an object using a magnet and multiple magnetic field sensors, the multiple magnetic field sensors being held in fixed relation to one another and in moveable relation to the magnet, wherein one of the magnet or the multiple magnetic field sensors is fixed to the object, the method comprising:
   calculating an estimate of a frequency of an approximately sinusoidal field reading versus position characteristic associated with the multiple magnetic field sensors and the magnet;
   acquiring readings of a first magnetic field sensor and a second magnetic field sensor of the multiple magnetic field sensors; and
   calculating an estimated position of the magnet relative to the first and second magnetic field sensors using the readings of the first and second magnetic field sensors, the estimated frequency, and a fixed distance between the first and second magnetic field sensors.

2. The method of claim 1, wherein:
   the multiple magnetic field sensors further include a third magnetic field sensor that is located between the first and second magnetic field sensors; and
   calculating an estimate of a frequency comprises:
      collecting readings of the first magnetic field sensor, the second magnetic field sensor, and the third magnetic field sensor; and
      calculating the estimated frequency using the collected readings of the first, second, and third magnetic field sensors and the fixed distance between the first and second magnetic field sensors.

3. The method of claim 2, wherein:
   the third magnetic field sensor is centered between the first and second magnetic field sensors; and
   calculating the estimated frequency includes evaluating the equation:

$$\hat{\omega} = \sqrt{\frac{2A3 - A2 - A1}{A3}} \left(\frac{2}{\Delta x}\right),$$

where $\hat{\omega}$ is the estimated frequency, A1 is the reading of the first magnetic field sensor, A2 is the reading of the second magnetic field sensor, A3 is the reading of the third magnetic field sensor, and $\Delta x$ is the fixed distance between the first and second magnetic field sensors.

4. The method of claim 2, wherein calculating an estimate of a frequency is performed before acquiring readings.

5. The method of claim 1, wherein calculating an estimate of a frequency comprises retrieving the estimate of the frequency from a memory.

6. The method of claim 1, wherein calculating an estimate of a frequency comprises estimating the frequency using characterization data associated with the magnet.

7. The method of claim 1, wherein:
   calculating an estimated position of the magnet relative to the first and second magnetic field sensors includes evaluating the equation:

$$\hat{x}_{mid} = \frac{1}{\hat{\omega}} \tan^{-1}\left(\frac{(A2 + A1)\hat{\omega}\Delta x}{2(A2 - A1)}\right)$$

where $\hat{x}_{mid}$ is representative of an estimated linear position of the magnet relative to a midpoint between the first and second magnetic field sensors, A1 is the reading of the first magnetic field sensor, A2 is the reading of the second magnetic field sensor, $\hat{\omega}$ is the estimated frequency, and $\Delta x$ is the fixed distance between the first and second magnetic field sensors.

8. The method of claim 1, further comprising:
repeating acquiring readings and calculating an estimated position to maintain an updated position estimate for the object.

9. The method of claim 8, further comprising:
occasionally updating the estimate of the frequency.

10. The method of claim 1, wherein:
the multiple magnetic field sensors include at least one of: a Hall effect sensor, a magnetoresistive (MR) sensor, and a magnetotransistor.

11. The method of claim 1, wherein calculating an estimate of a frequency includes:
collecting readings of the first magnetic field sensor and the second magnetic field sensor at least two different instances in time; and
calculating the estimated frequency using the collected readings of the first and second magnetic field sensors at the at least two different instances in time and the fixed distance between the first and second magnetic field sensors.

12. An apparatus comprising:
multiple magnetic field sensors for use in estimating the linear position of a magnet that moves in relation to the multiple magnetic field sensors, wherein the multiple magnetic field sensors include at least a first magnetic field sensor and a second magnetic field sensor held in fixed relation to one another and separated by a distance $\Delta x$; and
a controller to estimate the linear position of the magnet relative to the multiple magnetic field sensors using a calculated, estimated frequency of an approximately sinusoidal magnetic field reading versus displacement characteristic associated with the magnet and the multiple magnetic field sensors, a distance between the first and second magnetic field sensors, and readings of the first and second magnetic field sensors.

13. The apparatus of claim 12, further comprising:
a memory to store a value indicative of the estimated frequency, wherein the controller is coupled to the memory.

14. The apparatus of claim 13, wherein:
the controller is configured to occasionally update the value indicative of the estimated frequency stored within the memory.

15. The apparatus of claim 14, wherein:
the controller is configured to update the value indicative of the estimated frequency stored within the memory by receiving a new value from an external source and storing the new value or a derivative thereof in the memory.

16. The apparatus of claim 14, wherein:
the controller is configured to update the value indicative of the estimated frequency stored within the memory by estimating a new value and storing the new value in the memory.

17. The apparatus of claim 12, wherein:
the multiple magnetic field sensors includes a third magnetic field sensor that is located between the first and second magnetic field sensors; and
the controller is configured to calculate the estimated frequency of the approximately sinusoidal magnetic field reading versus displacement characteristic using readings of the first, second, and third magnetic field sensors and the fixed distance between the first and second magnetic field sensors.

18. The apparatus of claim 17, wherein:
the third magnetic field sensor is centered between the first and second magnetic field sensors; and
the controller is configured to calculate the estimated frequency based on the following equation:

$$\hat{\omega} = \sqrt{\frac{2A3 - A2 - A1}{A3}} \left(\frac{2}{\Delta x}\right),$$

where $\hat{\omega}$ is the estimated frequency, A1 is a reading of the first magnetic field sensor, A2 is a reading of the second magnetic field sensor, A3 is a reading of the third magnetic field sensor, and $\Delta x$ is the distance between the first and second magnetic field sensors.

19. The apparatus of claim 12, wherein:
the controller is configured to estimate the position of the magnet relative to the multiple magnetic field sensors based on the equation:

$$\hat{x}_{mid} = \frac{1}{\hat{\omega}} \tan^{-1}\left(\frac{(A2 + A1)\hat{\omega}\Delta x}{2(A2 - A1)}\right)$$

where $\hat{x}_{mid}$ is representative of an estimated position of the magnet relative to a midpoint between the first and second magnetic field sensors, A1 is a reading of the first magnetic field sensor, A2 is a reading of the second magnetic field sensor, $\hat{\omega}$ is the estimated frequency, and $\Delta x$ is the distance between the first and second magnetic field sensors.

20. The apparatus of claim 12, wherein:
the apparatus is implemented as a single integrated circuit that can be mounted in proximity to an external magnet.

21. The apparatus of claim 12, wherein:
the apparatus is implemented using multiple chips within a multi-chip module (MCM) that can be mounted in proximity to an external magnet.

22. The apparatus of claim 12, wherein:
the multiple magnetic field sensors are closely matched in sensitivity.

23. The apparatus of claim 12, wherein:
the multiple magnetic field sensors include at least one of: a Hall effect sensor, a magnetoresistive (MR) sensor, and a magnetotransistor.

24. The apparatus of claim 12, wherein:
the multiple magnetic field sensors are for use in estimating the position of a magnet that is affixed to a lens assembly of a camera; and
the controller includes an input to receive a position request signal requesting movement of the lens assembly as part of an autofocus operation, wherein the controller is configured to generate a control signal for use in moving the lens assembly in accordance with the position request signal based on the estimated position of the magnet.

25. The apparatus of claim 24, further comprising:
a driver to drive a motor that is coupled to the lens assembly in response to the control signal, wherein the multiple magnetic field sensors, the controller, and the driver are all implemented within a common integrated circuit (IC) or multi-chip module (MCM).

26. The apparatus of claim 12, wherein:
the controller is configured to calculate the estimated frequency of the approximately sinusoidal magnetic field reading versus displacement characteristic using readings of the first and second magnetic field sensors at two different instances in time and the fixed distance between the first and second magnetic field sensors.

27. A camera comprising:
a lens assembly having a magnet affixed thereto;
at least two magnetic field sensors held in fixed relation to one another and proximate to the magnet, the at least two magnetic field sensors including a first magnetic field sensor and a second magnetic field sensor, wherein the magnet is moveable with respect to the at least two magnetic field sensors;
a motor to move the lens assembly in a controlled manner;
a driver to drive the motor in response to a control signal; and
a controller to estimate a position of the lens assembly for use in focusing the camera, the controller to estimate the position of the lens assembly using a calculated, estimated frequency of an approximately sinusoidal magnetic field reading versus displacement characteristic associated with the magnet and the at least two magnetic field sensors, a distance between the first and second magnetic field sensors, and readings of the first and second magnetic field sensors.

28. The camera of claim 27, wherein:
the controller includes an input to receive a position request signal requesting movement of the lens assembly as part of an autofocus operation, wherein the controller is configured to generate the control signal for the driver for use in moving the lens assembly in accordance with the position request signal based on the estimated position of the lens assembly.

29. The camera of claim 27, wherein:
the controller is configured to estimate the position of the lens assembly based on the equation:

$$\hat{x}_{mid} = \frac{1}{\hat{\omega}} \tan^{-1}\left(\frac{(A2+A1)\hat{\omega}\Delta x}{2(A2-A1)}\right)$$

where $\hat{x}_{mid}$ is representative of an estimated position of the magnet relative to a midpoint between the first and second magnetic field sensors, A1 is a reading of the first magnetic field sensor, A2 is a reading of the second magnetic field sensor, $\hat{\omega}$ is the estimated frequency, and ix is the distance between the first and second magnetic field sensors.

30. The camera of claim 27, wherein:
the at least two magnetic field sensors includes a third magnetic field sensor that is located between the first and second magnetic field sensors; and
the controller is configured to calculate the estimated frequency using readings of the first, second, and third magnetic field sensors and the fixed distance between the first and second magnetic field sensors.

31. The camera of claim 30, wherein:
the third magnetic field sensor is centered between the first and second magnetic field sensors; and
the controller is configured to calculate the estimated frequency based on the following equation:

$$\hat{\omega} = \sqrt{\frac{2A3 - A2 - A1}{A3}} \left(\frac{2}{\Delta x}\right),$$

where $\hat{\omega}$ is the estimated frequency, A1 is a reading of the first magnetic field sensor, A2 is a reading of the second magnetic field sensor, A3 is a reading of the third magnetic field sensor, and $\Delta x$ is the distance between the first and second magnetic field sensors.

32. The camera of claim 27, wherein:
the controller is configured to calculate the estimated frequency of the approximately sinusoidal magnetic field reading versus displacement characteristic using readings of the first and second magnetic field sensors at two different instances in time and the fixed distance between the first and second magnetic field sensors.

33. A camera comprising:
a lens assembly having a magnet affixed thereto;
at least two magnetic field sensors held in fixed relation to one another and proximate to the magnet, the at least two magnetic field sensors including a first magnetic field sensor and a second magnetic field sensor, wherein the magnet is moveable with respect to the at least two magnetic field sensors;
a motor to move the lens assembly in a controlled manner;
a driver to drive the motor in response to a control signal; and
a controller to estimate a position of the lens assembly for use in focusing the camera, the controller to estimate the position of the lens assembly based, at least in part, on readings of the first and second magnetic field sensors and a distance between the first and second magnetic field sensors, the controller being configured to estimate the position based on the following equation:

$$\hat{x}_{mid} = \frac{B(A2+A1)\Delta x}{(2 \times (A2-A1))}$$

where B is a gain factor, A1 is a reading of the first magnetic field sensor, A2 is a reading of the second magnetic field sensor, and $\Delta x$ is the distance between the first and second magnetic field sensors.

34. The camera of claim 33, wherein:
the controller includes an input to receive a position request signal requesting movement of the lens assembly as part of an autofocus operation, wherein the controller is configured to generate the control signal for the driver for use in moving the lens assembly in accordance with the position request signal based on the estimated position of the lens assembly.

35. The camera of claim 33, wherein:
the controller and the at least two magnetic field sensors are implemented on a common integrated circuit (IC) or multi-chip module (MCM).

* * * * *

UNITED STATES PATENT AND TRADEMARK OFFICE
CERTIFICATE OF CORRECTION

Page 1 of 1

PATENT NO. : 9,042,716 B2
APPLICATION NO. : 13/967681
DATED : May 26, 2015
INVENTOR(S) : Bryan Cadugan et al.

It is certified that error appears in the above-identified patent and that said Letters Patent is hereby corrected as shown below:

In the specification,

Column 7, line 66 delete "readings one" and replace with --readings of one--.

Column 8, line 49 delete "of above described" and replace with --of above-described--.

Column 9, line 17 delete "above described" and replace with --above-described--.

Column 11, line 25-26 delete "may be alternatively" and replace with --may alternatively--.

Column 12, line 47 delete "three of" and replace with --three or--.

Column 13, line 34 delete "magnetic relative" and replace with --magnet relative--.

Column 14, line 35 delete ", such as" and replace with --, such an--.

In the claims,

Column 19, line 43 delete "ix" and replace with --$\Delta$x--.

Signed and Sealed this
Fifth Day of April, 2016

Michelle K. Lee
*Director of the United States Patent and Trademark Office*